United States Patent [19]

Matsui

[11] Patent Number: 4,470,178
[45] Date of Patent: Sep. 11, 1984

[54] FASTENER

[75] Inventor: Kazuhiro Matsui, Toyoake, Japan

[73] Assignee: Kitagawa Industries Co., Ltd., Nagoya, Japan

[21] Appl. No.: 425,404

[22] Filed: Sep. 28, 1982

[51] Int. Cl.³ .................... A44B 17/00; F16B 13/04
[52] U.S. Cl. .................................... 24/289; 24/297; 174/138 D
[58] Field of Search ............... 24/297, 289, 208 A, 24/213 R, 207; 174/138 D

[56] References Cited

U.S. PATENT DOCUMENTS

| 3,246,375 | 4/1966 | Landwer | 24/297 |
| 3,764,729 | 10/1973 | Kowalewski | 174/138 D |
| 3,852,849 | 12/1974 | Pestka | 174/138 D |
| 3,889,320 | 6/1975 | Koscik | 24/297 |
| 3,909,883 | 10/1975 | Fegen | 174/138 D |
| 4,122,583 | 10/1978 | Grittner et al. | 24/208 A |
| 4,192,478 | 3/1980 | Coules | 174/138 D |
| 4,200,900 | 4/1980 | McGeorge | 174/138 D |
| 4,312,614 | 1/1982 | Palmer et al. | 24/208 A |

FOREIGN PATENT DOCUMENTS 1006613 3/1977 Canada ................. 174/138 D

Primary Examiner—Victor N. Sakran
Attorney, Agent, or Firm—Oblon, Fisher, Spivak, McClelland & Maier

[57] ABSTRACT

In a fastener of the invention, a base is connected to an attachment mechanism, support element having pushing planes are connected to the base through arms slanted upwards from the base, and surface of a board is pushed by pushing planes by means of resilient deformation of the support elements, thereby the board is fixed above a chassis spaced by a given distance without interfering with other electronic parts on the chassis.

3 Claims, 5 Drawing Figures

FASTENER

BACKGROUND OF THE INVENTION

1. Field of the Invention

The present invention relates to fasteners for attaching an element to be held, such as a plate, to a board securely.

2. Description of the Prior Art

It is usually seen that a board such as a chassis or a print board is installed within an electric apparatus and another print board or panel is attached to the previously installed board keeping a given parallel distance and insulation state. In such a case, a fastener with one end having an attachment mechanism for attaching the substance to be held and another end having a fixing leg member for fixing it to the board. For example, in a conventional fastener as shown in FIG. 1, a fixing leg member 1 comprises a support element 3 with side cross-section of arcuate shape which pushes surface of a board 2 by means of resilient deformation, and an elastic non-return piece 9 of wedge shape which is connected to center portion of the support element 3 through a stem 4 and to lateral ends thereof through thin connecting elements 7, 8. In this constitution, the resilient non-return piece 9 passes through a fixing hole 10 of the board 2 and grasps the board 2 from upper and lower sides in co-operation with the support element 3. In the grasped state, top end portion of the support element 3 of the fixing leg member 1 spreads laterally, thereby as shown in dashed line of FIG. 1 other electronic part 11 to be installed closely to the fastener must be arranged out of a space occupied by the support element 3 (A in FIG. 1), therefore the conventional constitution has disadvantage in that wasteful space is required on the board 2.

SUMMARY OF THE INVENTION

In order to eliminate above-mentioned disadvantage in the prior art, an object of the present invention is to provide a fastener wherein a base is connected to an attachment mechanism, support elements having pushing planes are connected to the base through arms slanted upwards from the base, and the surface of a board is pushed with whole pushing planes by means of elastic deformation of the support elements.

DETAILED DESCRIPTION OF THE INVENTION

Figure 1:
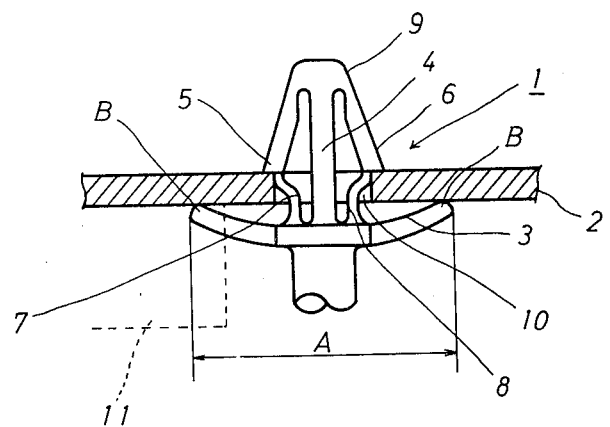
FIG. 1 is a front view of an example in prior art.
Figure 2:
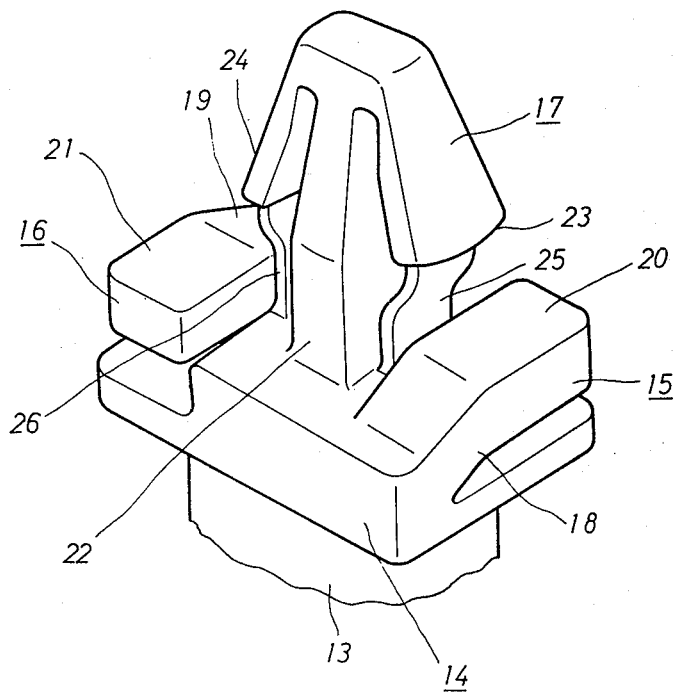
FIG. 2 through FIG. 4 show a first embodiment of the present invention, FIG. 2 being a perspective view, FIG. 3 a front view and FIG. 4 a side view.
Figure 3:
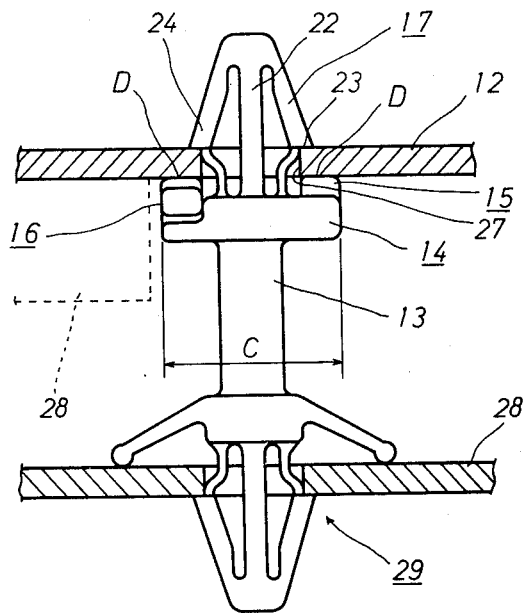
Figure 4:
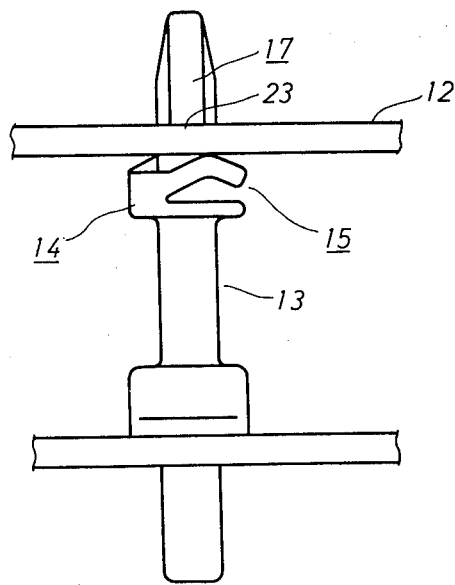

An attachment mechanism of suitable form to attach a substance to a board 12 may be selected depending on sorts of the substance to be held. In an embodiment of the present invention as shown in FIGS. 3 and 4, a chassis 28 is spaced from the board 12 by a given distance and held in an insulation state, and an attachment mechanism 29 comprising a resilient non-return piece and a resilient support element is formed integrally with lower portion of a holding shaft 13. A fixing leg member comprising a pair of support elements 15, 16 and a resilient non-return piece 17 is formed on a rectangular base 14 connected to upper portion of the holding shaft 13. The support elements 15, 16 of the fixing leg member are connected respectively to arms 18, 19 slanted upwards from the rectangular base 14, and have pushing planes 20, 21. The support elements 15 and 16 are directed respectively in front and rear directions along both lateral surfaces of the base 14 so that spreading in a lateral direction can be reduced to minimum.

The resilient non-return piece 17 is in wedge shape, and center portion thereof is connected to the base 14 through an upstanding stem 22 on the base 14 and lateral ends 23, 24 thereof are also connected to the base 14 through thin connecting elements 25, 26. The lateral ends 23, 24 can be resiliently deformed inwards.

A fixing hole 27 which is slightly smaller than the resilient non-return piece 17 is provided on the board 12. When the fastener is attached to the board 12, the resilient non-return piece 17 is forced into the fixing hole 17, thereby the lateral ends 23, 24 are resiliently deformed inwards and pass through the fixing hole 27 and the bottom surface of the lateral ends 23, 24 is engaged with the front surface of the board 12. Then a pair of the support elements 15, 16 are resiliently deformed downwards and the pushing planes 20, 21 thereof push the rear surface of the board 12, thereby the board 12 is grasped at the front and rear surfaces and the fastener is attached to the board 12 securely.

Since the support elements 15, 16 of the fixing leg member are arranged on the rectangular base 14 along lateral surfaces, dimension can be reduced in a lateral direction (C in FIG. 3) and a longitudinal direction, other part 28 on the board 12 can be arranged quite closely, and the support elements 15, 16 can push the rear surface of the board 12 using the pushing planes 20, 21 (D in FIG. 3).

Figure 5:
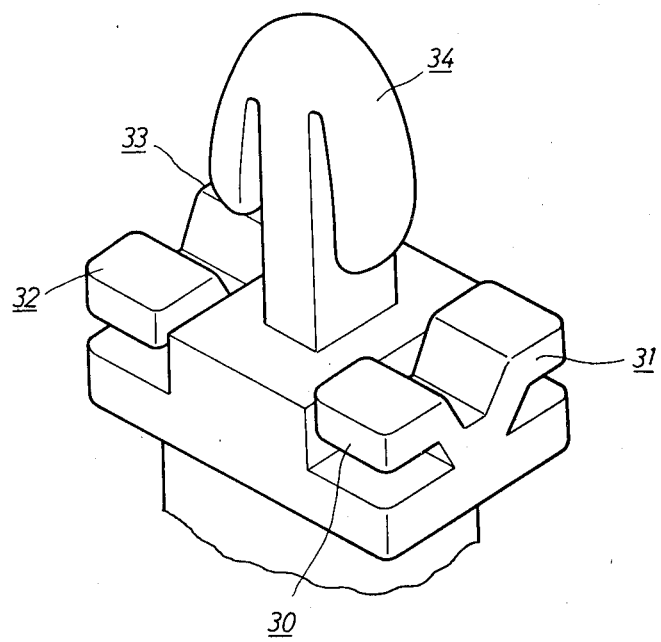
FIG. 5 is a perspective view of a second embodiment of the present invention.

FIG. 5 is a perspective view showing a second embodiment of the present invention. In this embodiment, four support elements 30, 31, 32 and 33 are provided, a resilient non-return piece 34 has a different shape from that of the first embodiment, and there is no thin connecting element. This embodiment can perform a similar function to that of the first embodiment, and particularly the pushing using four support elements 30, 31, 32 and 33 enables more secure grasping.

As above described, the present invention provides a fastener wherein a base is connected to an attachment mechanism for attaching a substance to a board, a fixing leg member formed on the base comprises a plurality of support elements which are connected to the base through arms slanted upwards from the base and provided with pushing planes, and a resilient non-return piece which is connected to the base through a stem at a center portion and through connecting elements at lateral ends, a pair of the support elements are resiliently deformed so as to push the board surface by whole pushing planes, and the resilient non-return piece passes through a fixing hole of the board and grasps the board in co-operation with the support elements. Thereby the present invention has an effect that the fixing leg members can be made very small and wasted space on the board can be reduced.

Also the invention has effect that the support elements can push the board surface with whole pushing planes and the fixing is effected strongly and securely against load applied to the fastener in longitudinal and lateral directions.

What is claimed is:

1. A fastener for attaching an element to a planar body having first and second opposing surfaces and an aperture extending between said surfaces, said fastener comprising:
- a base to which said element is adapted to be attached, said base having a peripheral surface;
- a resilient non-return piece extending from a first surface of said base, said non-return piece including a stem secured to a central portion of said base surface and extending in a first direction essentially normal to said base surface, laterally extending connecting elements fixed to said stem, and thin connecting pieces connecting said laterally extending connecting elements to said base, said non-return piece being shaped to fit through said aperture whereby said connecting elements engage said first surface of said planar body; and
- at least two fixing elements mounted on said base, each of said fixing elements being symmetrical about a vertical plane passing through said stem and comprising an arm adjacent to, and extending parallel to, said peripheral surface of said base, each said arm slanting away from said first base surface in said first direction, whereby said arm defines a distal end spaced from said first base surface in said first direction, each of said fixing elements also comprising a resilient support element extending from said distal end and having a planar surface facing and engaging said second body surface when said non-return piece is inserted in said aperture with said connecting elements engaging said first surface,
- wherein said fixing elements do not extend beyond said base peripheral surface in any direction transverse to said first direction.

2. A fastener according to claim 1, wherein the resilient non-return piece is formed in a wedge shape.

3. A fastener according to claim 1, wherein four of said fixing elements are provided.

* * * * *